US008471205B2

(12) United States Patent
Gertsenshteyn (10) Patent No.: US 8,471,205 B2
(45) Date of Patent: Jun. 25, 2013

(54) HYBRID PHOTODIODE/APD FOCAL PLANE ARRAY FOR SOLID STATE LOW LIGHT LEVEL IMAGERS

(75) Inventor: Michael Gertsenshteyn, Lexington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/507,426

(22) Filed: Jun. 27, 2012

(65) Prior Publication Data

US 2013/0048858 A1    Feb. 28, 2013

Related U.S. Application Data

(60) Provisional application No. 61/527,250, filed on Aug. 25, 2011.

(51) Int. Cl.
*G01J 5/10* (2006.01)

(52) U.S. Cl.
USPC ...................... 250/332; 250/339.05

(58) Field of Classification Search
USPC ............. 250/330, 332, 338.1, 339.01, 339.05
See application file for complete search history.

(56) References Cited

U.S. PATENT DOCUMENTS

2010/0019128 A1 *  1/2010  Itzler ........................ 250/208.1
2011/0249148 A1 * 10/2011  Prescher et al. ............. 348/234

* cited by examiner

*Primary Examiner* — Mark R Gaworecki
(74) *Attorney, Agent, or Firm* — Maine Cernota & Rardin; Vernon Carl Maine; Daniel J. Long (57) ABSTRACT

A hybrid solid state imaging focal plane array (FPA) for night vision systems achieves a high dynamic range from deeply overcast starlight to full daylight by interleaving non-avalanche photodiode (NAP) pixels with APD pixels in a single imaging plane controlled by a common readout circuit. The APD pixels provide high performance at low light levels, while the NAP pixels provide unsaturated images in full daylight. The APD pixels can be Discrete. In low light the readout circuit can disable the NAP pixels and interpolate the NAP pixels using the APD signals. In daylight the readout circuit can do the opposite. The FPA can be digitally fused with sensors in a separate plane such as InGaAs APD's that detect wavelengths outside of the visible band. The NAP pixels can outnumber the APD pixels, for example by three-to-one. The APD's can be silicon for visible light, or InGaAs for SWIR light.

12 Claims, 9 Drawing Sheets
(5 of 9 Drawing Sheet(s) Filed in Color)

HYBRID PHOTODIODE/APD FOCAL PLANE ARRAY FOR SOLID STATE LOW LIGHT LEVEL IMAGERS

RELATED APPLICATIONS

This application claims the benefit of U.S. Provisional Application No. 61/527,250, filed Aug. 25, 2011 which is herein incorporated by reference in its entirety for all purposes.

FIELD OF THE INVENTION

The invention relates to low light vision apparatus, and more particularly, to image intensifiers that are operable over a wide dynamic range of ambient light intensities.

BACKGROUND OF THE INVENTION

Night vision devices are used extensively by the military to enable operations at night under low ambient light conditions. Applications include goggles worn by foot soldiers, as well as apparatus used by soldiers in military vehicles and aircraft. Applications further include imaging apparatus included in unmanned ground and airborne vehicles. Similar night vision equipment is also used by law enforcement, and for certain other civilian applications.

While the obvious application of a night vision device is for use under low light conditions, there are often circumstances where it is desirable to use a night vision device under a wide range of light conditions ranging from moonless starlight to full daylight. For example, a scene viewed at night may be illuminated artificially in some areas and not in others areas, causing the light level to vary widely as a soldier looks and/or travels across the scene between brightly lit areas and areas that are not illuminated. If the soldier removes the night vision device when looking at illuminated areas, it may take several seconds for his or her eyes to adjust, and then several more seconds may be required for the soldier's eyes to readjust back to use of the night vision device. A night vision device may also be sensitive to wavelengths that are not visible to the human eye, making it desirable to use the device under all lighting conditions.

Traditional night vision devices use an analog "image intensifier" ("II") tube to enhance an image obtained at low ambient light levels. Intensification factors can range from 1000× (moonlight) up to 20,000× (moonless, clear starlight) and even up to 50,000× (deeply overcast starlight) and higher.

However, II tubes are expensive, complicated, and low in manufacturing yield of components and tube assemblies. II tubes can also be heavy and bulky, compare to digital focal plane arrays, can be vulnerable to direct sunlight and laser radiation, and must be replaced periodically.

II tubes also typically have limited resolution when used under daylight conditions, and they are difficult to optically fuse with other sensors that operate at wavelengths outside of the visible band.

Digital low light focal plane arrays are known for long wave and mid wave infrared detection. However, attempts in the prior art to create digital low light focal plane arrays for visible light have failed, due at least in part to electron gain limitations associated with conventional silicon photodiodes. Some attempts have been made to create low visible light digital focal plane arrays using intensified charge-coupled device CMOS (ICCD/CMOS) imagers in lieu of II tubes. However, such devices can be heavy, bulky, and overly expensive, and can require a significant amount of power from batteries or from a power supply, which must be carried by a foot soldier.

Figure 1A:
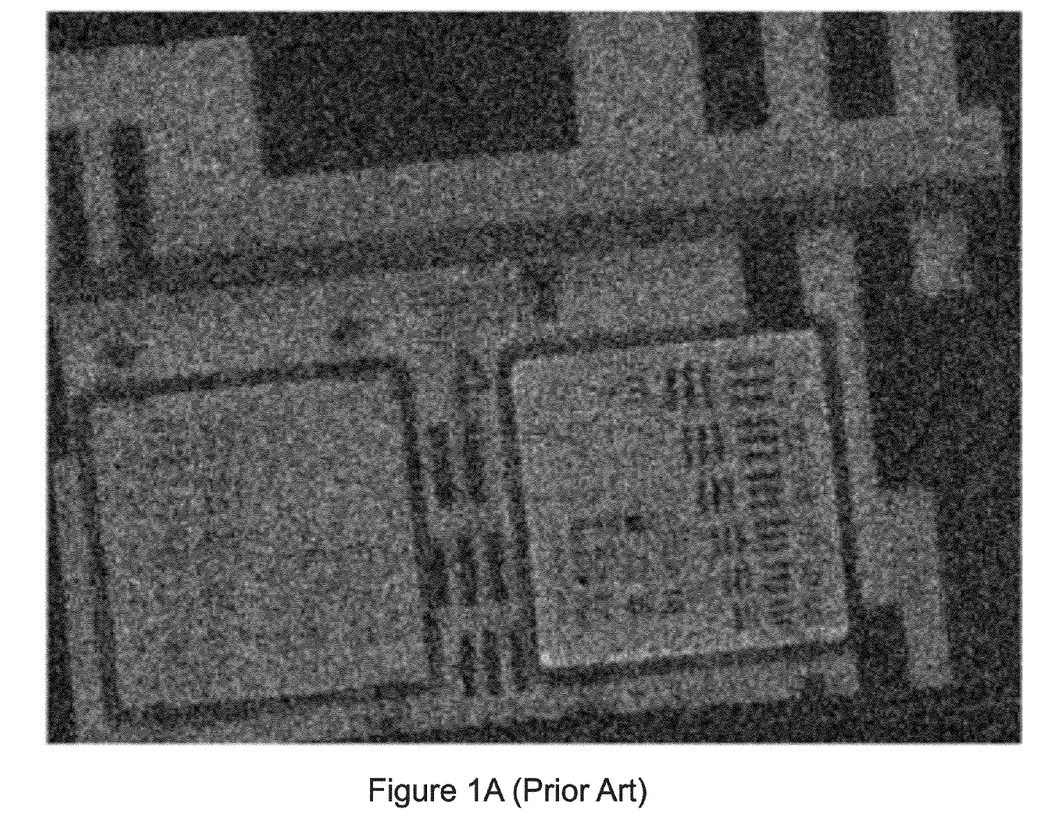
FIG. 1A is an image of a test pattern obtained under low light conditions using a focal plane array of the prior art containing LLL CCD/CMOS pixels.
Figure 1B:
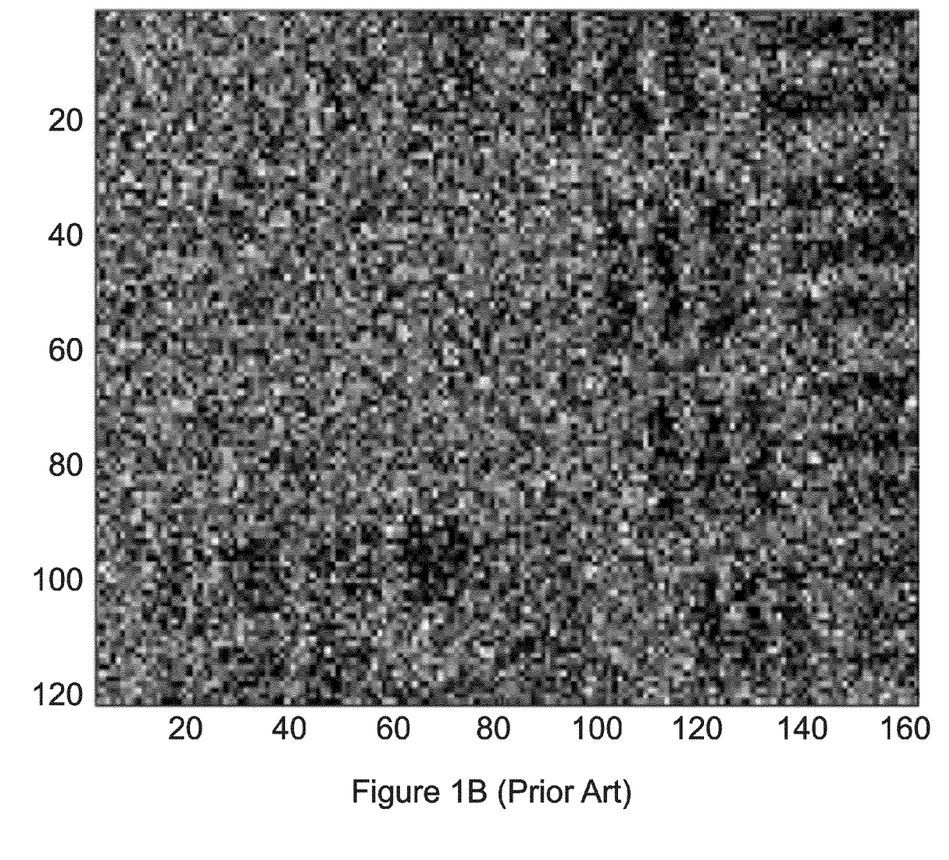
FIG. 1B is an enlarged portion of the image of FIG. 1A.

Attempts have also been made to create low visible light digital focal plane arrays using low light level (LLL) CCD/CMOS imagers. An example at low light is shown in FIG. 1A, and an enlargement of a portion of FIG. 1A is presented in FIG. 1B. However, current LLL CCD/CMOS imagers have proven to be incapable of night-time performance below ¼ moon conditions, due to high dark current and little to no electron gain.

What is needed, therefore, is a solid state digital imaging sensor for night vision devices that is not bulky or overly expensive, has low power requirements, provides high performance images at low light levels down to overcast starlight and high contrast unsaturated images in full daylight, and can be digitally fused with devices that are sensitive to wavelengths outside of the visible band.

SUMMARY OF THE INVENTION

The present invention is a hybrid solid state digital imaging focal plane array (FPA) for use in low light level imaging systems over a range of ambient light intensities from full daylight down to starlight and below. The hybrid FPA achieves this dynamic range by interleaving non-avalanche photodiode (NAP) pixels with avalanche photodiode (APD) pixels in a single imaging plane controlled by a common readout circuit. In some embodiments, the APD pixels are Discrete APD pixels. An APD is a highly sensitive semiconductor electronic device that exploits the photoelectric effect to convert light to electricity. APDs can be thought of as photodetectors that provide a built-in first stage of gain through avalanche multiplication. From a functional standpoint, they can be regarded as the semiconductor analog to photomultipliers.

The APD pixels in the present invention provide high performance images at low light levels that have not been achieved using the LLL CCD/CMOS solid state sensors of the prior art. The NAP pixels provide high contrast unsaturated images under daylight conditions. The hybrid FPA of the present invention thereby provides high performance images at low light levels down to deeply overcast starlight and high contrast unsaturated images in full daylight.

Compared to the prior art, the focal plane array of the present invention provides enhanced sensitivity and signal to noise ratio and enhanced resolution at low light levels due to the use of APD pixels. The present invention further provides enhanced dynamic range due to the hybrid use of interleaved APD and NAP pixels. Reductions in size and weight and cost improvements as compared to analog image intensifier (II) tubes of the prior art are achieved due to compatibility of the digital focal plane array technology of the present invention with mass production.

In embodiments, the common readout circuit enables the APD pixels while disabling the NAP pixels under low light conditions, and enables the NAP pixels while disabling the APD pixels under daylight conditions. Some of these embodiments interpolate the APD pixels using the NAP signals under daylight conditions to create a single daytime image, and interpolate the NAP pixels using the APD signals under nighttime conditions to create a single nighttime image.

In certain embodiments, the sensors of the hybrid focal plane array are digitally fused with sensors in a separate array that are sensitive to wavelengths outside of the visible band, such as short wave infrared, mid wave infrared, and/or long wave infrared sensors.

In general, fewer pixels are required to form an optimal image at low light levels as compared to high light levels. In various embodiments, the NAP pixels outnumber the APD pixels, and in some of these embodiments the ratio of NAP pixels to APD pixels is three to one.

In some embodiments, the APD's are made from silicon, and are sensitive to visible light. In other embodiments, the APD's are made from indium gallium arsenide (InGaAs), and are sensitive to short wave infrared light. These embodiments have an advantage under some circumstances because under night conditions there are typically more photons available in the short wave infrared, especially between 0.9 u to 1.7 u, than in the visible band. In similar embodiments, a focal plane array of the present invention using silicon-based APD's sensitive to visible light is digitally fused with InGaAs APD's located in a separate array.

The present invention is a hybrid focal plane array (FPA) applicable to night vision devices. The hybrid FPA includes a plurality of non-avalanche photodiode (NAP) pixels configured in an array that is able to form unsaturated images at light levels up to full daylight, said array having regularly spaced gaps therein, a plurality of avalanche photodiode (APD) pixels disbursed among and co-located with the NAP pixels, the APD pixels being located in the gaps of the NAP pixel array, the APD pixels being thereby arranged in an array that is able to form images at light levels down to starlight, and a common readout circuit in electronic communication with the NAP pixels and the APD pixels, the common readout circuit being able to control the formation of images by the hybrid FPA.

In embodiments, the APD pixels are Discrete APD pixels. In some embodiments the common readout circuit is configured to enable the NAP pixels only under daylight conditions. In some of these embodiments the common readout is able to interpolate the NAP pixels using the APD signals when the NAP pixels are not enabled.

In certain embodiments the common readout circuit is configured to enable the APD pixels only under low light conditions. In some of these embodiments the common readout is able to interpolate the APD pixels from the NAP signals when the APD pixels are not enabled.

In various embodiments the NAP pixels outnumber the APD pixels. In some of these embodiments the ratio of NAP pixels to APD pixels is three to one.

In some embodiments the APD pixels are able to form images at light levels down to deeply overcast starlight. In other embodiments the APD's are indium gallium arsenic (InGaAs) avalanche photodiodes.

In certain embodiments the hybrid FPA is digitally fused with an array of pixels that are sensitive to a wavelength of light lying outside of the visible wavelength band. And in some of these embodiments the hybrid FPA is digitally fused with an array including Indium Gallium Arsenic APD pixels.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 2A:
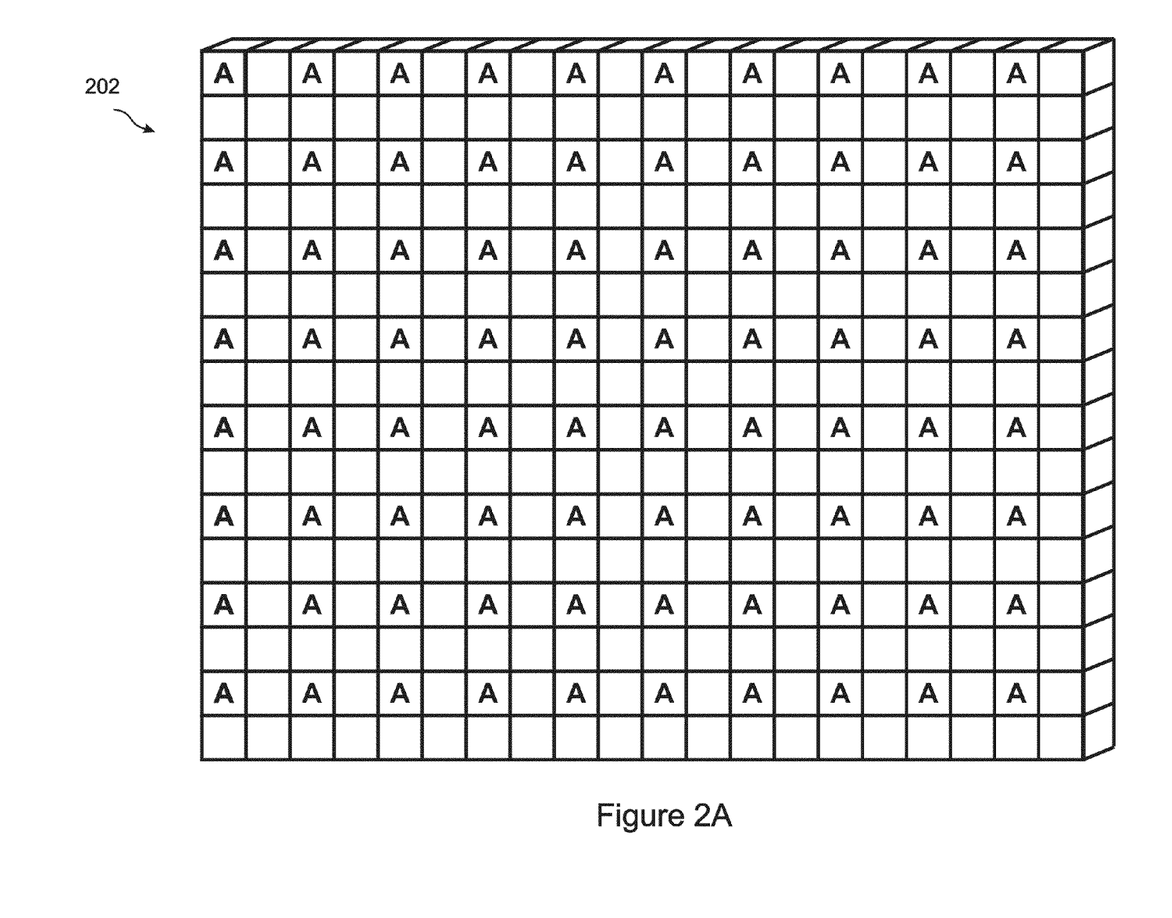
FIG. 2A is a top view of an FPA in an embodiment of the present invention where the locations of the APD pixels have been marked with the letter A.
Figure 2B:
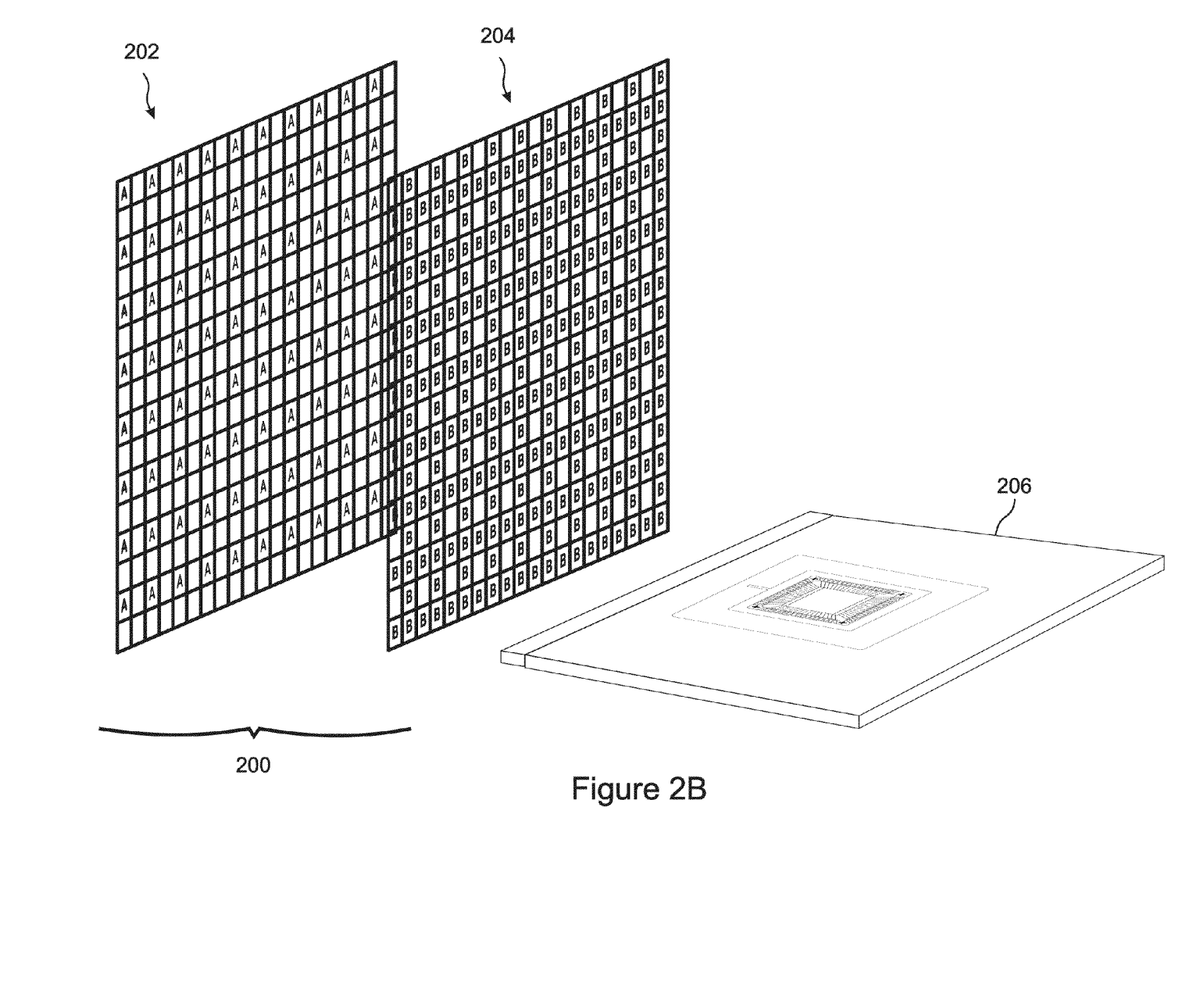
FIG. 2B is a perspective view of the array of APD pixels of FIG. 2A shown in exploded relationship with an array of NPD pixels and a common readout circuit.

With reference to FIGS. 2A and 2B, the present invention is a hybrid solid state digital imaging focal plane array (FPA) 200 for use in low light level imaging systems over a range of ambient light intensities from full daylight down to starlight and below. The hybrid FPA achieves this dynamic range by interleaving non-avalanche photodiode (NAP) pixels 204 with avalanche photodiode (APD) 202 pixels in a single imaging plane controlled by a common readout circuit 206.

FIG. 2A is a top view of an FPA in an embodiment of the present invention where the locations of the APD pixels have been marked with the letter A. FIG. 2B shows the arrays of APD pixels 202 in exploded relationship with an array of NAP pixels 204 (marked with the letter B) and a common readout circuit. Note that FIG. 2B is not necessarily intended to imply that the NAP pixels 204 and APD pixels 202 are pre-assembled in separate arrays.

Figure 2C:
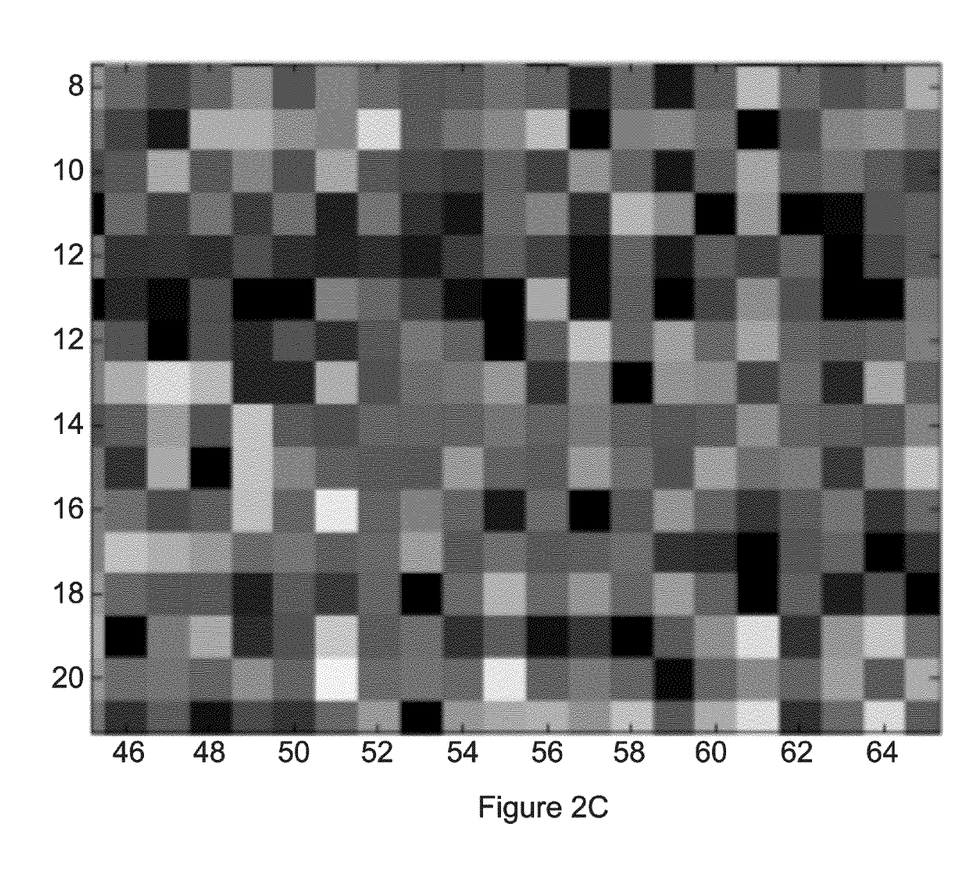
FIG. 2C is an image of the pixels of a hybrid FPA in an embodiment of the present invention in which the APD pixels have been painted green.

The NAP pixels 204 in the hybrid FPA 200 provide high quality images under daylight conditions, and the APD pixels 202 provide high quality images under low light conditions that are significantly lower in noise and higher in resolution than images obtained using LLL CCD/CMOS sensors of the prior art (see FIGS. 1 and 2). The hybrid FPA 200 of the present invention thereby provides high performance at low light levels down to deeply overcast starlight as well as high contrast unsaturated images in full daylight. FIG. 2C is an image of the pixels of a hybrid FPA in an embodiment of the present invention wherein the APD pixels are Discrete APD pixels. The APD pixels have been painted green in the figure for clarity of illustration.

Figure 3A:
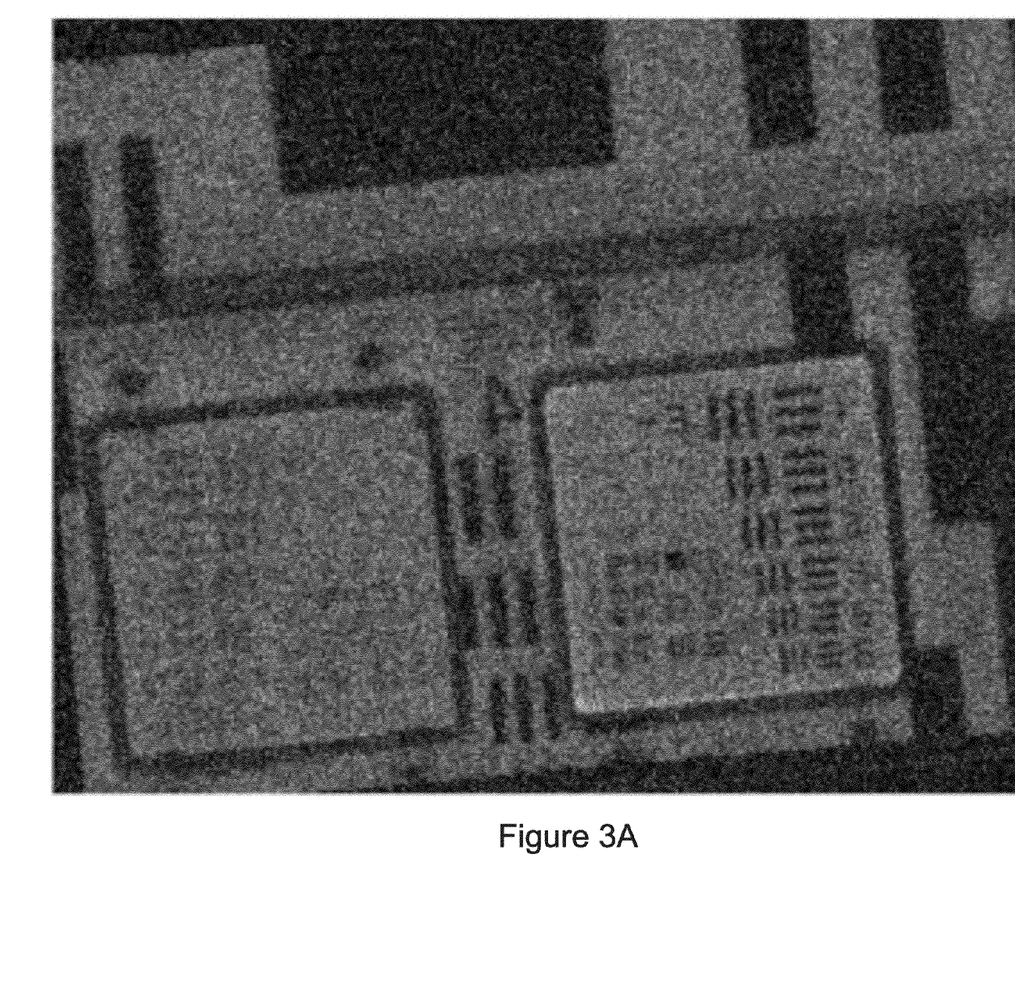
FIG. 3A is an image of a test pattern obtained under low light conditions using all of the pixels of the FPA of FIG. 2C.
Figure 3B:
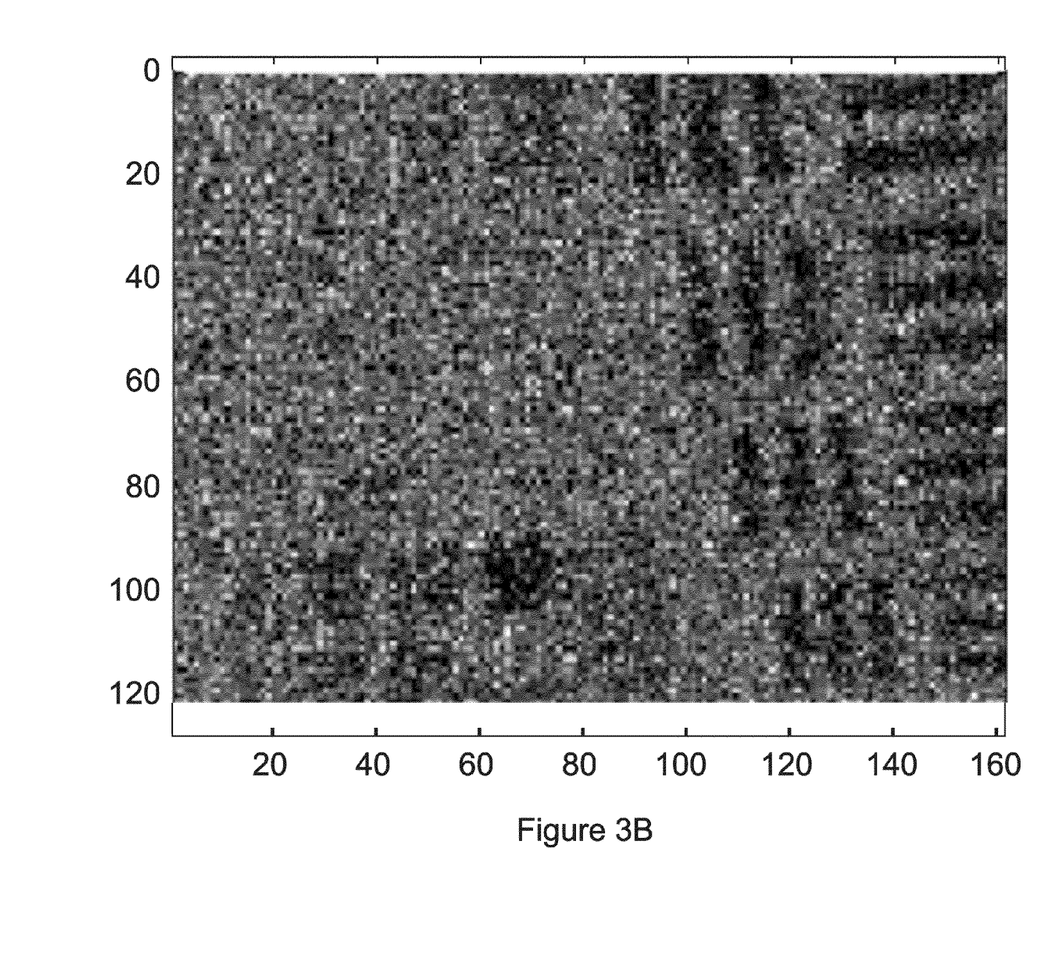
FIG. 3B is an enlarged portion of the image of FIG. 3A.

FIG. 3A is an image of a test pattern obtained from an embodiment of the present invention under low light conditions using all of the pixels 202, 204 in the hybrid FPA 200. FIG. 3B shows an enlarged section of FIG. 3A.

Compared to the prior art, the focal plane array 200 of the present invention provides enhanced sensitivity and signal to noise ratio and enhanced resolution at low light levels due to the use of APD pixels 202. The present invention further provides enhanced dynamic range due to the hybrid use of interleaved APD 202 and NAP pixels 204. Reductions in size and weight and cost improvements as compared to analog image intensifier (II) tubes of the prior art are achieved due to compatibility of the digital focal plane array technology of the present invention with mass production.

Figure 4A:
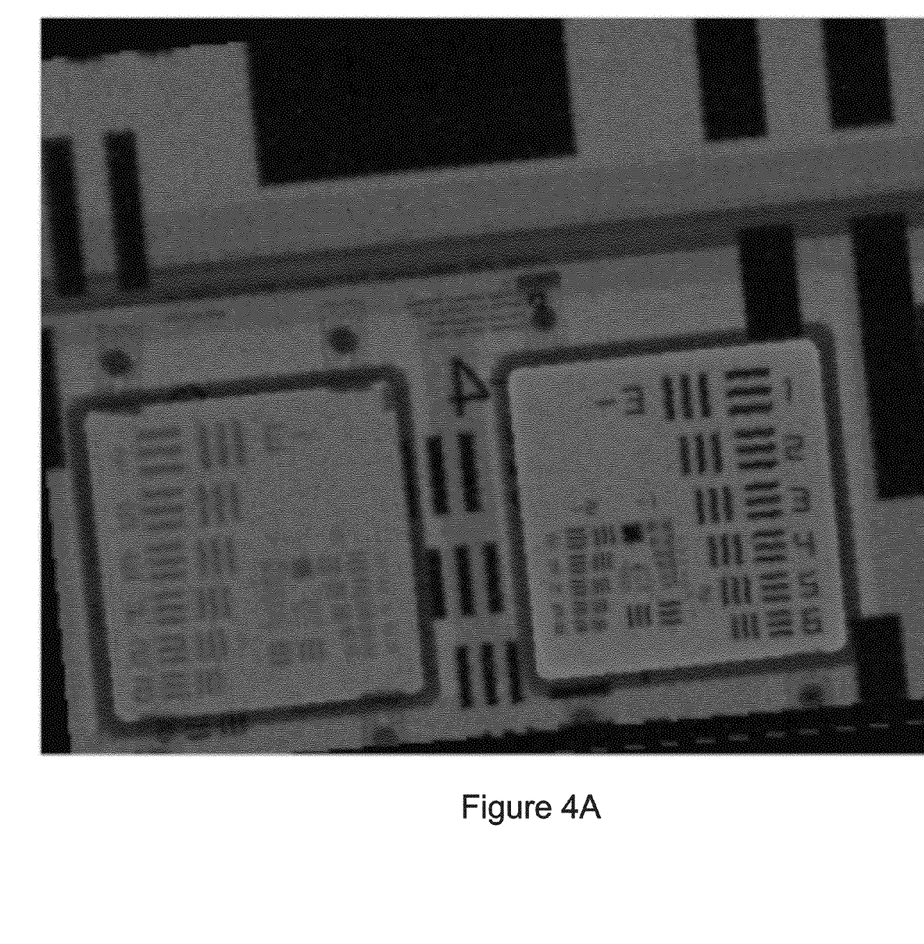
FIG. 4A is an image of a test pattern obtained under low light conditions using only the avalanche photodiode pixels of the FPA of FIG. 2C.
Figure 4B:
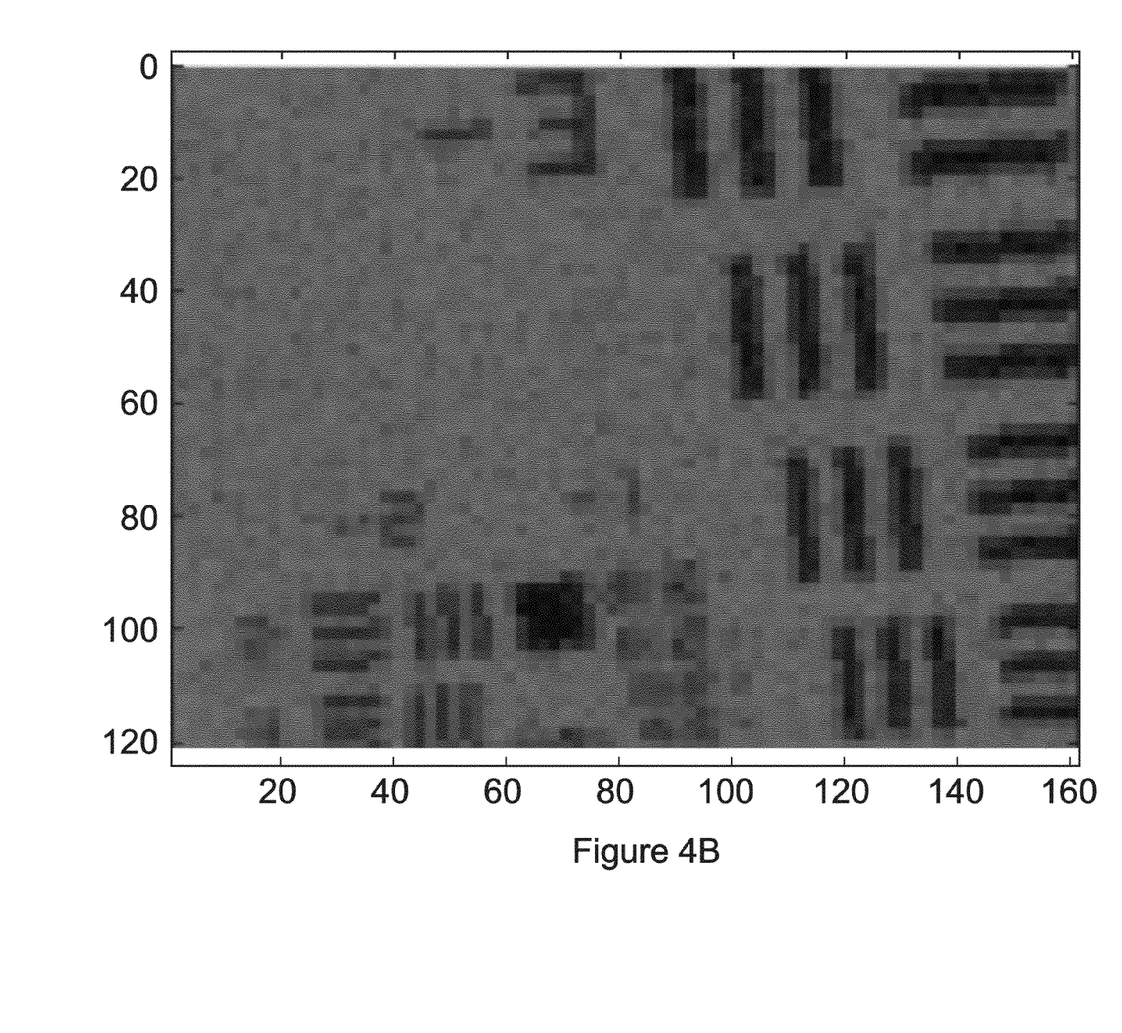
FIG. 4B is an enlarged portion of the image of FIG. 4A.

In embodiments, the common readout circuit 206 enables the APD pixels 202 while disabling the NAP pixels 204 under low light conditions, and enables the NAP pixels 204 while disabling the APD pixels 202 under daylight conditions. Some of these embodiments interpolate the APD 202 pixels using the NAP signals under daylight conditions to create a single daytime image, and interpolate the NAP pixels 204 using the APD signals under nighttime conditions to create a single nighttime image. FIG. 4A presents an image obtained by the embodiment of FIG. 2A under low light conditions wherein the NAP pixels have been disabled and interpolated using the APD signals. FIG. 4B presents an enlarged region of FIG. 4A.

In certain embodiments, the sensors of the hybrid focal plane array are digitally fused with sensors in a separate array that are sensitive to wavelengths outside of the visible band, such as short wave infrared, mid wave infrared, and/or long wave infrared sensors.

In various embodiments, the NAP pixels outnumber the APD pixels. In the embodiment of FIG. 2C the ratio of NAP pixels to APD pixels is three to one.

In some embodiments, the APD's are made from silicon, and are sensitive to visible light. In other embodiments, the APD's are made from indium gallium arsenide (InGaAs), and are sensitive to short wave infrared light. These embodiments have an advantage under some circumstances because under night conditions there are typically more photons available in the short wave infrared band, especially between 0.9 u to 1.7 u, than in the visible band. In similar embodiments, a focal plane array of the present invention using silicon-based APD's sensitive to visible light are digitally fused with indium gallium arsenide APD's located in a separate array.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A hybrid focal plane array (FPA) applicable to night vision devices, the hybrid FPA comprising:
    a plurality of non-avalanche photodiode (NAP) pixels configured in an array that is able to form unsaturated images at light levels up to full daylight, said array having regularly spaced gaps therein;
    a plurality of avalanche photodiode (APD) pixels disbursed among and co-located with the NAP pixels, the APD pixels being located in the gaps of the NAP pixel array, the APD pixels being thereby arranged in an array that is able to form images at light levels down to starlight; and
    a common readout circuit in electronic communication with the NAP pixels and the APD pixels, the common readout circuit being able to control the formation of images by the hybrid FPA.

2. The hybrid FPA of claim 1, wherein the APD pixels are Discrete APD pixels.

3. The hybrid FPA of claim 1, wherein the common readout circuit is configured to enable the NAP pixels only under daylight conditions.

4. The hybrid FPA of claim 3, wherein the common readout is able to interpolate the NAP pixels using the APD signals when the NAP pixels are not enabled.

5. The hybrid FPA of claim 4, wherein the common readout is able to interpolate the APD pixels from the NAP signals when the APD pixels are not enabled.

6. The hybrid FPA of claim 5, wherein the ratio of NAP pixels to APD pixels is three to one.

7. The hybrid FPA of claim 1, wherein the common readout circuit is configured to enable the APD pixels only under low light conditions.

8. The hybrid FPA of claim 1, wherein the NAP pixels outnumber the APD pixels.

9. The hybrid FPA of claim 1, wherein the APD pixels are able to form images at light levels down to deeply overcast starlight.

10. The hybrid FPA of claim 1, wherein the APD's are indium gallium arsenic (InGaAs) avalanche photodiodes.

11. The hybrid FPA of claim 1, wherein the hybrid FPA is digitally fused with an array of pixels that are sensitive to a wavelength of light lying outside of the visible wavelength band.

12. The hybrid FPA of claim 11, wherein the hybrid FPA is digitally fused with an array including Indium Gallium Arsenic APD pixels.

* * * * *